United States Patent
Tanaka et al.

(10) Patent No.: US 11,411,032 B2
(45) Date of Patent: Aug. 9, 2022

(54) SENSOR CHIP AND ELECTRONIC DEVICE

(71) Applicant: SONY SEMICONDUCTOR SOLUTIONS CORPORATION, Kanagawa (JP)

(72) Inventors: Akira Tanaka, Kanagawa (JP); Yusuke Otake, Kanagawa (JP); Toshifumi Wakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/864,380

(22) Filed: May 1, 2020

(65) Prior Publication Data
US 2020/0258930 A1    Aug. 13, 2020

Related U.S. Application Data

(63) Continuation of application No. 16/329,464, filed as application No. PCT/JP2017/041010 on Nov. 15, 2017, now Pat. No. 10,672,818.

(30) Foreign Application Priority Data

Nov. 29, 2016 (JP) ................................. 2016-231585

(51) Int. Cl.
   *H01L 27/146*    (2006.01)
   *H01L 31/107*    (2006.01)
   *H01L 31/0232*   (2014.01)

(52) U.S. Cl.
   CPC .... *H01L 27/14629* (2013.01); *H01L 27/1463* (2013.01); *H01L 27/1464* (2013.01);
   (Continued)

(58) Field of Classification Search
   CPC ......... H01L 27/14629; H01L 31/02327; H01L 27/14627; H01L 27/14623; H01L 27/1463;
   (Continued)

(56) References Cited

U.S. PATENT DOCUMENTS 9,312,401 B2    4/2016  Webster
10,672,818 B2   6/2020  Tanaka et al.
(Continued)

FOREIGN PATENT DOCUMENTS

EP    2787531      10/2014
JP    2004-273640   9/2004
(Continued)

OTHER PUBLICATIONS

Official Action (with English translation) for Japanese Patent Application No. 2016-231585, dated Sep. 15, 2020, 8 pages.
(Continued)

*Primary Examiner* — Ahmed N Sefer
(74) *Attorney, Agent, or Firm* — Sheridan Ross P.C.

(57) ABSTRACT

An imaging device comprises a sensor substrate including a pixel array that includes at least a first pixel. The first pixel includes an avalanche photodiode including a light receiving region, a cathode, and an anode. The first pixel includes a wiring layer electrically connected to the cathode and arranged in the sensor substrate such that the wiring layer is in a path of incident light that exits the light receiving region.

7 Claims, 15 Drawing Sheets

(52) U.S. Cl.
CPC .. *H01L 27/14623* (2013.01); *H01L 27/14627* (2013.01); *H01L 27/14634* (2013.01); *H01L 27/14636* (2013.01); *H01L 31/02327* (2013.01); *H01L 31/107* (2013.01)

(58) Field of Classification Search
CPC ......... H01L 27/14634; H01L 27/14636; H01L 27/1464; H01L 31/107
See application file for complete search history.

(56) References Cited

U.S. PATENT DOCUMENTS

| | | | |
|---|---|---|---|
| 2013/0193546 | A1 | 8/2013 | Webster et al. |
| 2014/0167200 | A1* | 6/2014 | Sun .................... H01L 27/1463 257/443 |
| 2014/0210035 | A1* | 7/2014 | Park .................... H01L 27/1446 257/458 |
| 2015/0200222 | A1* | 7/2015 | Webster ............ H01L 27/14609 250/208.1 |
| 2016/0079464 | A1 | 3/2016 | Sasaki et al. |
| 2016/0099371 | A1 | 4/2016 | Webster |
| 2017/0040371 | A1* | 2/2017 | Izuhara ............. H01L 27/14634 |
| 2017/0186798 | A1* | 6/2017 | Yang ................. H01L 27/14629 |
| 2018/0090536 | A1* | 3/2018 | Mandai ................. G01S 7/4863 |
| 2019/0006399 | A1 | 1/2019 | Otake et al. |
| 2019/0181177 | A1 | 6/2019 | Kobayashi et al. |
| 2019/0198548 | A1 | 6/2019 | Yorikado et al. |
| 2020/0273895 | A1* | 8/2020 | Sasago .............. H01L 27/14607 |

FOREIGN PATENT DOCUMENTS

| | | |
|---|---|---|
| JP | 2010-147474 | 7/2010 |
| JP | 2013-048278 | 3/2013 |
| JP | 2014-203961 | 10/2014 |
| JP | 2014-225647 | 12/2014 |
| JP | 2015-026708 | 2/2015 |
| JP | 2015-041746 | 3/2015 |
| JP | 2015-084392 | 4/2015 |
| JP | 2016-062996 | 4/2016 |
| WO | WO 2012/032353 | 3/2012 |
| WO | WO 2014/162705 | 10/2014 |

OTHER PUBLICATIONS

International Search Report and Written Opinion prepared by the European Patent Office dated Jan. 26, 2018, for International Application No. PCT/JP2017/041010.

Official Action for U.S. Appl. No. 16/329,464, dated Jul. 19, 2019, 11 pages.

Notice of Allowance for U.S. Appl. No. 16/329,464, dated Jan. 23, 2020, 7 pages.

* cited by examiner

SENSOR CHIP AND ELECTRONIC DEVICE

CROSS REFERENCE TO RELATED APPLICATION

This application is a continuation of U.S. patent application Ser. No. 16/329,464 filed Feb. 28, 2019 which is a national stage application under 35 U.S.C. 371 and claims the benefit of PCT Application No. PCT/JP2017/041010 having an international filing date of 15 Nov. 2017, which designated the United States, which PCT application claimed the benefit of Japanese Patent Application No. 2016-231585 filed 29 Nov. 2016, the entire disclosures of each of which are incorporated herein by reference.

TECHNICAL FIELD

The present disclosure relates to a sensor chip and an electronic device. More particularly, the disclosure relates to a sensor chip and an electronic device having single photon avalanche diode (SPAD) pixels improved in characteristics.

BACKGROUND ART

Recent years have witnessed growing interest in distance image sensors that measure distance by the time-of-flight (ToF) method. A distance image sensor may be configured, for example, with a pixel array having multiple SPAD pixels arranged two-dimensionally using complementary metal oxide semiconductor (CMOS) integrated circuit technology. In a SPAD pixel impressed with a voltage far larger than a breakdown voltage, a single photon incident on a high-electrical-field PN junction region triggers avalanche amplification. At that point, the time in which a current flows instantaneously is detected to perform highly accurate distance measurements.

For example, PTL 1 discloses a technology by which a photodiode array made of avalanche photodiodes is structured to provide isolation between pixels so as to reduce crosstalk with adjacent pixels caused by light emissions in high electrical field regions.

Also, PTL 2 discloses a technology by which SPADs embedded with a layer that forms high electrical field regions are depleted with bias to improve the sensitivity of SPAD pixels.

CITATION LIST

Patent Literatures

[PTL 1]
JP 2013-48278 A
[PTL 2]
JP 2015-41746 A

SUMMARY

Technical Problems

However, the structure disclosed in PTL 1 merely reduces optical crosstalk by physically separating the pixels using insulating films. With this structure, the sensitivity of the pixels has yet to be improved.

Also, the structure disclosed in PTL 2 leaves the high electrical field regions in the pixels emitting light so that photons enter adjacent pixels, causing crosstalk involving unintended detection of photons in the adjacent pixels. Furthermore, incident light is transmitted to a plane (surface) which is opposite a light incidence plane (back) and on which gates and wiring are formed. This can lead to a drop in pixel sensitivity.

Given these problems, there has been a need for SPAD pixels with improved characteristics that prevent (or alternatively, reduce) the generation of crosstalk and boost sensitivity.

The present disclosure has been made in view of the above circumstances. An object of the disclosure is therefore to improve the characteristics of SPAD pixels.

Solution to Problems

According to a first aspect of the present technology, an imaging device comprises a sensor substrate including a pixel array that includes at least a first pixel. The first pixel includes an avalanche photodiode including a light receiving region, a cathode, and an anode; and a wiring layer electrically connected to the cathode and arranged in the sensor substrate such that the wiring layer is in a path of incident light that exits the light receiving region.

According to a second aspect of the present technology, an imaging device comprises a logic substrate for processing image signals; a sensor substrate including at least a first pixel. The first pixel includes an avalanche photodiode that includes a light receiving region, a cathode, and an anode; and a wiring layer electrically connected to the cathode and between the light receiving region and the logic substrate such that the wiring layer is in a path of incident light that exits the light receiving region. The imaging device includes a bonding section that electrically connects the sensor substrate to the logic substrate.

According to a third aspect of the present technology, an imaging device comprises a sensor substrate including at least a first pixel. The first pixel includes an avalanche photodiode that includes a light receiving region, a cathode, and an anode; and a wiring layer electrically connected to the cathode. The imaging device includes an isolation section to isolate the first pixel from a second pixel that is adjacent to the first pixel; and a plurality of conductive pads for bonding the sensor substrate to a logic substrate. The plurality of conductive pads include a first conductive pad electrically connected to the anode; a second conductive pad electrically connected to the wiring layer; and a third conductive pad electrically connected to the isolation section.

Advantageous Effect of Invention

According to the above-outlined aspects of the present disclosure, the characteristics of SPAD pixels are improved.

DESCRIPTION OF EMBODIMENTS

Some specific embodiments of the present technology are described below in detail with reference to the accompanying drawings.

(Typical Configuration of Sensor Chip)

Figure 1:
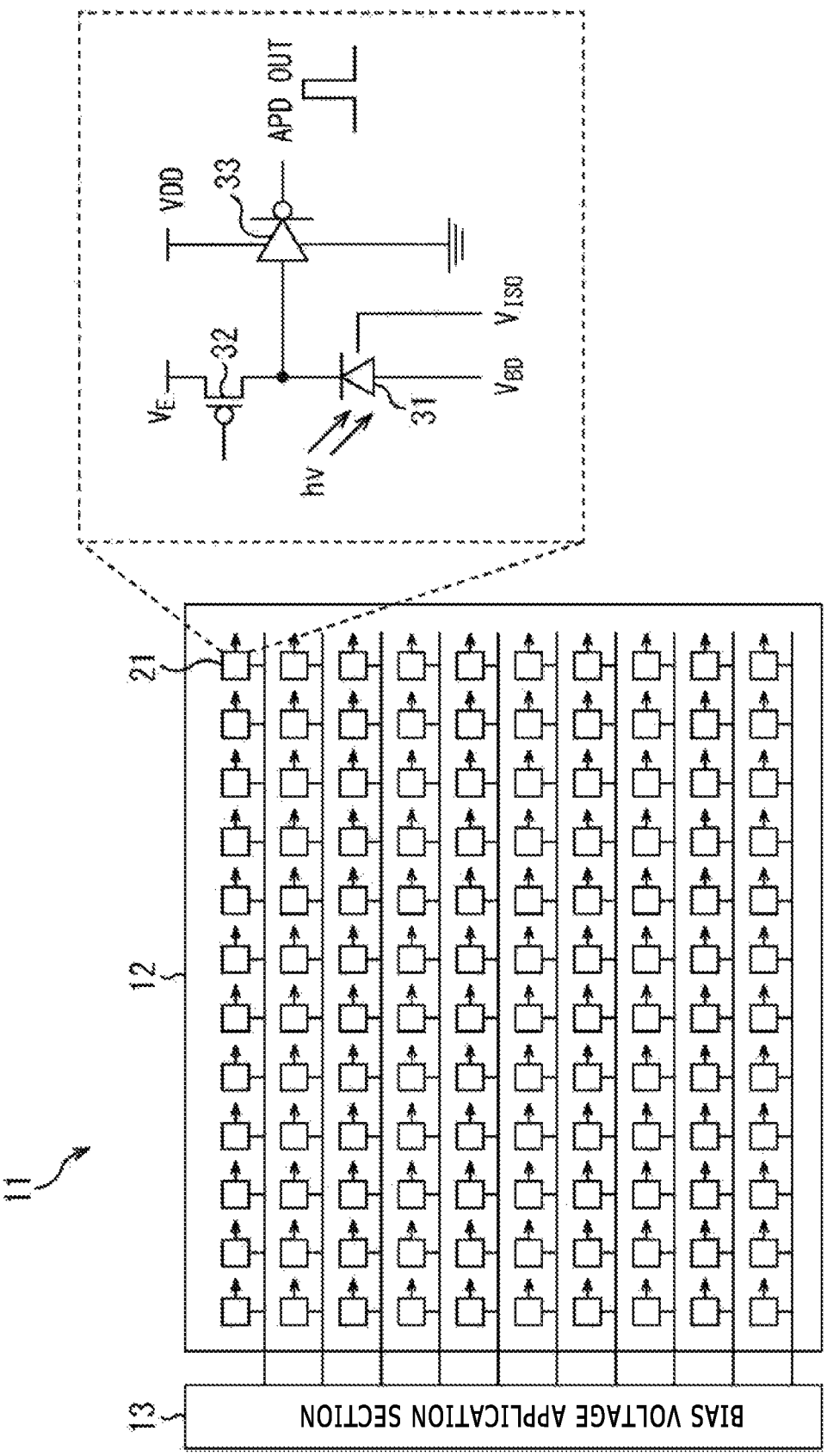
FIG. 1 is a block diagram depicting a typical configuration of a sensor chip as one embodiment of the present technology.

FIG. 1 is a block diagram depicting a typical configuration of a sensor chip as one embodiment of the present technology.

In FIG. 1, a sensor chip 11 is made up of a pixel array section 12 and a bias voltage application section 13.

The pixel array section 12 is a light-receiving surface that receives light collected by an optical system, not depicted, the pixel array section 12 having multiple SPAD pixels 21 arranged therein in a matrix pattern. As depicted on the right side in FIG. 1, each SPAD pixel 21 is configured to include a SPAD element 31, a p-type metal-oxide-semiconductor field-effect transistor (MOSFET) 32, and a CMOS inverter 33.

The SPAD element 31 forms an avalanche amplification region when impressed with a large negative voltage $V_{BD}$ at the cathode, thus amplifying by the avalanche effect the electrons generated by an incident single photon. When the voltage due to the electrons amplified by the SPAD element 31 by the avalanche effect reaches the negative voltage $V_{BD}$, the p-type MOSFET 32 performs quenching that involves returning to an initial voltage by releasing the electrons amplified by the SPAD element 31. The CMOS inverter 33 rectifies the voltage generated by the electrons amplified by the SPAD element 31, outputting a light-receiving signal (APD OUT) involving the generation of a pulse waveform starting from the arrival time of an incoming single photon.

The bias voltage application section 13 applies a bias voltage to each of the SPAD pixels 21 arranged in the pixel array section 12.

With the sensor chip 11 configured as described above, each SPAD pixel 21 outputs a light-receiving signal that is fed to a downstream arithmetic processing section, not depicted. For example, the arithmetic processing section performs an arithmetic process to obtain the distance to an object from each SPAD pixel 21 based on the timing of generation of a pulse indicative of the arrival time of a single photon from each light-receiving signal. A distance image is then generated on the basis of the obtained distances arranged two-dimensionally, each of the distances representing the distance to the object detected by each of the SPAD pixels 21.

(First Configuration Example of SPAD Pixel)

Figure 2:
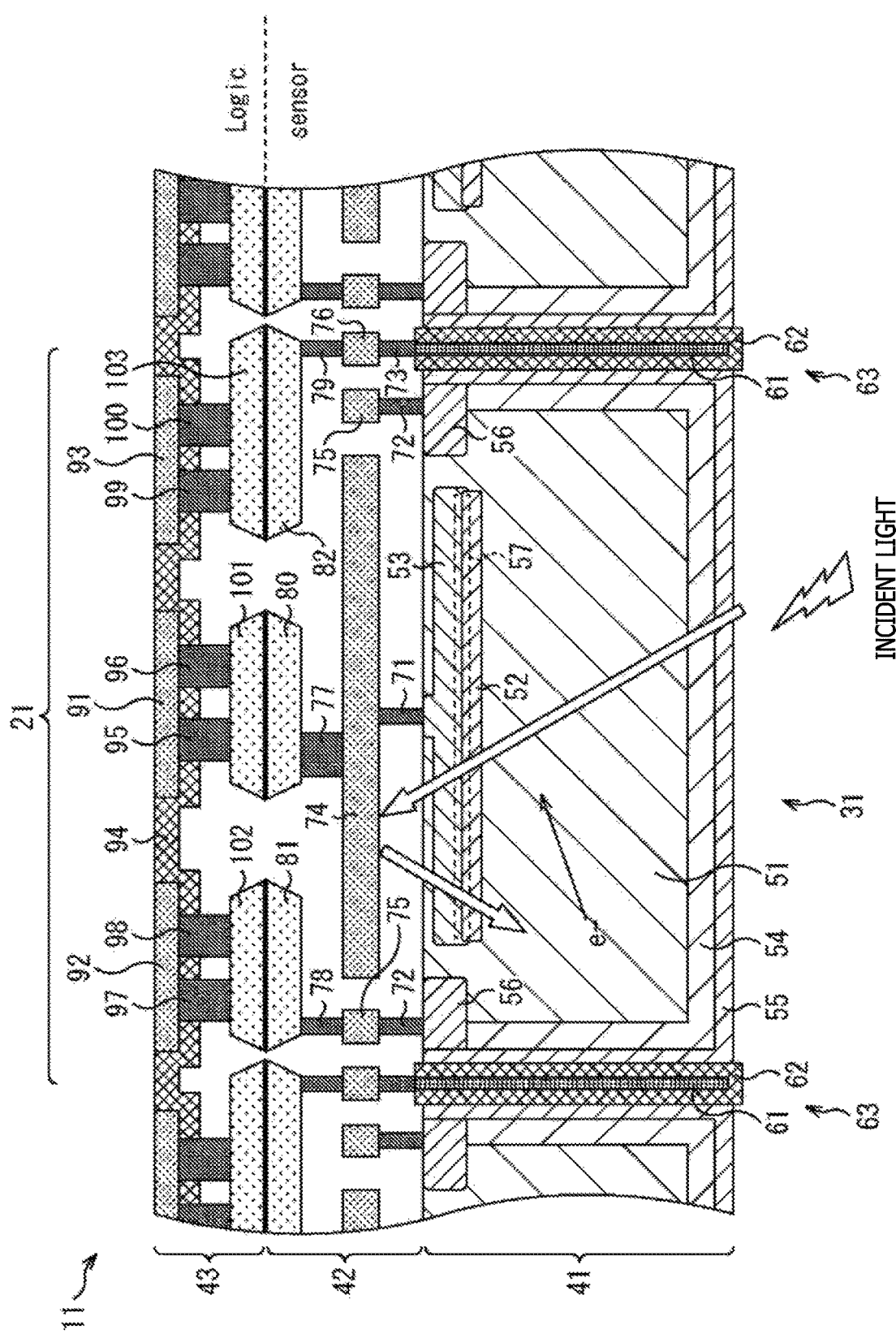
FIG. 2 is a schematic diagram depicting a first configuration example of a SPAD pixel as viewed cross-sectionally.
Figure 3:
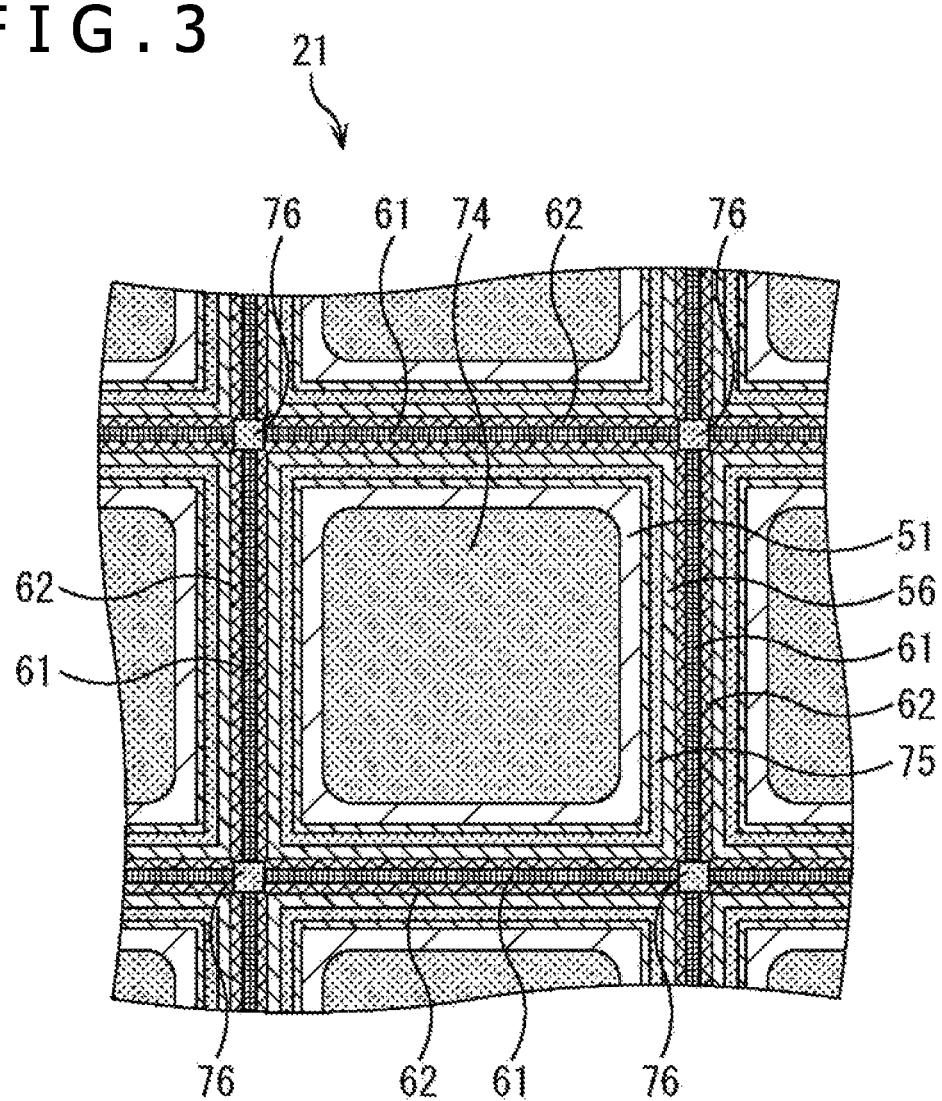
FIG. 3 is a schematic diagram depicting the first configuration example of the SPAD pixel as viewed two-dimensionally in a wiring layer.

Described below with reference to FIGS. 2 and 3 is a first configuration example of the SPAD pixel 21 formed in the sensor chip 11. FIG. 2 depicts the configuration example of the SPAD pixel 21 as viewed cross-sectionally. FIG. 3 depicts the configuration example of the SPAD pixel 21 as viewed two-dimensionally in the wiring layer.

As depicted in FIG. 2, the sensor chip 11 has a layered structure with a sensor substrate 41, a sensor-side wiring layer 42, and a logic-side wiring layer 43 stacked therein. A logic circuit board, not depicted, is stacked over the logic-side wiring layer 43. The logic circuit board is configured to include the bias voltage application section 13, the p-type MOSFETs 32, and the CMOS inverters 33 depicted in FIG. 1, for example. The sensor chip 11 may be manufactured, for example, by a method in which the sensor-side wiring layer 42 is formed over the sensor substrate 41 and the logic-side wiring layer 43 over the logic circuit board, before the sensor-side wiring layer 42 and the logic-side wiring layer 43 are bonded together over a bonding surface (indicated by broken lines in FIG. 2).

The sensor substrate 41 may be a semiconductor substrate made of thinly sliced monocrystal silicon controlled to have a p-type or n-type impurity concentration. The SPAD element 31 is formed for each SPAD pixel 21. The back of the sensor substrate 41 in FIG. 2 constitutes a light-receiving surface that receives light. The sensor-side wiring layer 42 is stacked on a surface of the sensor substrate 41 opposite the light-receiving surface thereof.

The sensor-side wiring layer 42 and the logic-side wiring layer 43 include wiring for feeding voltages to be applied to the SPAD elements 31, as well as wiring for retrieving from the sensor substrate 41 the electrons generated by the SPAD elements 31.

The SPAD element 31 is configured to include an N-well 51, a P-type diffusion layer 52, an N-type diffusion layer (or cathode) 53, a hole accumulation layer 54, a pinning layer 55, and a high concentration P-type diffusion layer 56 (or anode), all formed in the sensor substrate 41. In the SPAD element 31, an avalanche amplification region 57 is formed by a depletion layer produced where the P-type diffusion layer 52 and the N-type diffusion layer 53 are connected with each other. One or more of elements 51, 52, 53, 56, and 57 may be referred to herein as a light receiving region.

The N-well 51 is formed by having the impurity concentration of the sensor substrate 41 controlled to n-type. As such, the N-well 51 forms an electrical field for transferring to the avalanche amplification region 57 the electrons generated by photoelectric conversion in the SPAD element 31. Alternatively, the N-well 51 may be replaced with a P-well by having the impurity concentration of the sensor substrate 41 controlled to p-type.

The P-type diffusion layer 52 is a high concentration P-type diffusion layer (P+) formed near the surface of the sensor substrate 41 and over the back of the N-type diffusion layer 53 (bottom side in FIG. 2) in a manner covering approximately the entire surface of the SPAD element 31.

The N-type diffusion layer 53 is a high concentration N-type diffusion layer (N+) formed near the surface of the sensor substrate 41 and over the surface of the P-type diffusion layer 52 (top side in FIG. 2) in a manner covering approximately the entire surface of the SPAD element 31. The N-type diffusion layer 53 is formed partially to protrude in a manner reaching the surface of the sensor substrate 41. This structure is intended to connect with a contact electrode 71 that supplies the negative voltage to form the avalanche amplification region 57.

The hole accumulation layer 54 is a P-type diffusion layer (P) formed in a manner covering the side and back of the N-well 51 to accumulate holes. Also, the hole accumulation layer 54 is electrically connected with the anode 56 of the SPAD element 31 to permit bias adjustment. This boosts the hole concentration in the hole accumulation layer 54 and reinforces the pinning that includes the pinning layer 55, thereby suppressing the generation of a dark current, for example.

The pinning layer 55 is a high concentration P-type diffusion layer (P+) formed over surfaces outside the hole accumulation layer 54 (i.e., back of the sensor substrate 41 and sides in contact with an insulating film 62). As with the hole accumulation layer 54, the pinning layer 55 suppresses the generation of a dark current, for example.

The high concentration P-type diffusion layer 56 is a P-type diffusion layer (P++) of high concentration formed near the surface of the sensor substrate 41 in a manner surrounding the periphery of the N-well 51. The high concentration P-type diffusion layer 56 is used to connect with a contact electrode 72 that electrically connects the hole accumulation layer 54 with the anode 56 of the SPAD element 31.

The avalanche amplification region 57 is a high electrical field region formed by a large negative voltage applied to the N-type diffusion layer 53 over a boundary surface between the P-type diffusion layer 52 and the N-type diffusion layer 53. As such, the avalanche amplification region 57 amplifies the electrons (e−) generated by a single photon incident on the SPAD element 31.

Also in the sensor chip 11, a dual-structure pixel-to-pixel isolation section (or isolation section) 63 made of a metal film (or reflective material) 61 and an insulating film (or insulating material) 62 between adjacent SPAD elements 31 provides insulation therebetween. As shown, the pixel-to-pixel isolation section 63 is at a peripheral area of the SPAD pixel 21 to isolate the SPAD pixel 21 from neighboring pixels. As also shown, the insulating material 62 surrounds the reflective material 61 in a trench formed in the sensor substrate 41. As shown in FIG. 3, in a plan view, the isolation section 63 forms a grid pattern to isolate pixels from one another. The pixel-to-pixel isolation section 63 may be formed to penetrate from the back to the surface of the sensor substrate 41, for example.

The metal film 61 is a film formed by a light reflecting metal (e.g., tungsten). The insulating film 62 is a film having insulation characteristics such as silicon dioxide ($SiO_2$). For example, the metal film 61 may be embedded in the sensor substrate 41 in such a manner that the surface of the metal film 61 is covered with the insulating film 62, forming the pixel-to-pixel isolation section 63. The pixel-to-pixel isolation section 63 isolates adjacent SPAD elements 31 electrically and optically from each other.

The sensor-side wiring layer 42 is configured to include contact electrodes 71 to 73, metal wiring (collectively and/or individually referred to as a wiring layer) 74 to 76, contact electrodes 77 to 79, and metal pads 80 to 82. As shown, at least a portion of metal wiring 74 to 76 is in a path of incident light that exits the light receiving region 51, 52, and/or 53. As shown in FIG. 3, in the plan view, the wiring layer 74 is in a central portion of the SPAD pixel 21 and covers the contact electrode 71 (and the cathode 53).

The contact electrode 71 connects the N-type diffusion layer 53 with the metal wiring 74. The contact electrode 72 connects the high concentration P-type diffusion layer 56 with the metal wiring 75. The contact electrode 73 connects the metal film 61 with the metal wiring 76.

The metal wiring 74 is formed to be wider than the avalanche amplification region 57, i.e., in a manner at least covering the avalanche amplification region 57 as depicted in FIG. 3, for example. The metal wiring 74 reflects the light transmitted through the SPAD element 31 to the SPAD element 31 as indicated by hollow arrows in FIG. 2.

The metal wiring 75 is formed to surround the periphery of the metal wiring 74 in a manner overlapping with the high concentration P-type diffusion layer 56 as depicted in FIG. 3, for example. The metal wiring 76 is formed to connect with the metal film 61 in the four corners of the SPAD pixel 21 as depicted in FIG. 3, for example.

The contact electrode 77 connects the metal wiring 74 with the metal pad 80. The contact electrode 78 connects the metal wiring 75 with the metal pad 81. The contact electrode 79 connects the metal wiring 76 with the metal pad 82.

The metal pads 80 to 82 are used respectively to connect, electrically and mechanically, with metal pads 101 to 103 formed in the logic-side wiring layer 43, via a metal (Cu) constituting each of the metal pads.

The logic-side wiring layer 43 is configured to include electrode pads 91 to 93, an insulating layer 94, contact electrodes 95 to 100, and metal pads 101 to 103.

The electrode pads 91 to 93 are each used to connect with the logic circuit board (not depicted). The insulating layer 94 insulates the electrode pads 91 to 93 from one another.

The contact electrodes 95 and 96 connect the electrode pad 91 with the metal pad 101. The contact electrodes 97 and 98 connect the electrode pad 92 with the metal pad 102. The contact electrodes 99 and 100 connect the electrode pad 93 with the metal pad 103.

The metal pad 101 is bonded to the metal pad 80, the metal pad 102 is bonded to the metal pad 81, and the metal pad 103 is bonded to the metal pad 82.

In the wiring structure described above, the electrode pad 91 is connected, for example, with the N-type diffusion layer 53 via the contact electrodes 95 and 96, the metal pad 101, the metal pad 80, the contact electrode 77, the metal wiring 74, and the contact electrode 71. Thus in the SPAD pixel 21, a large negative voltage applied to the N-type diffusion layer 53 may be supplied from the logic circuit board to the electrode pad 91.

The electrode pad 92 is configured to connect with the high concentration P-type diffusion layer 56 via the contact electrodes 97 and 98, the metal pad 102, the metal pad 81, the contact electrode 78, the metal wiring 75, and the contact electrode 72. Thus in the SPAD pixel 21, the anode of the SPAD element 31 connected electrically with the hole accumulation layer 54 is connected to the electrode pad 92. This permits bias adjustment for the hole accumulation layer 54 via the electrode pad 92.

Furthermore, the electrode pad 93 is configured to connect with the metal film 61 via the contact electrodes 99 and 100, the metal pad 103, the metal pad 82, the contact electrode 79, the metal wiring 76, and the contact electrode 73. Thus in the SPAD pixel 21, the bias voltage fed from the logic circuit board to the electrode pad 93 is applied to the metal film 61.

The SPAD pixel 21, as described above, is configured in such a manner that the metal wiring 74 is formed to be wider than the avalanche amplification region 57 to at least cover it and that the metal film 61 is formed to penetrate the sensor substrate 41. That is, the SPAD pixel 21 is configured to make the metal wiring 74 and the metal film 61 surround the SPAD element 31 except for its light incident surface, constituting a reflecting structure. With this structure, the SPAD pixel 21 causes the metal wiring 74 and the metal film 61 to reflect light. This effect prevents (or alternatively, reduces) the generation of optical crosstalk and improves the sensitivity of the SPAD element 31.

The SPAD pixel 21 is also configured to have the hole accumulation layer 54 surround the side and bottom of the N-well 51 and to connect the hole accumulation layer 54 electrically with the anode 56 of the SPAD element 31, thus permitting bias adjustment. Furthermore, the SPAD pixel 21 applies the bias voltage to the metal film 61 of the pixel-to-pixel isolation section 63, generating an electrical field that assists carriers in the avalanche amplification region 57.

Structured as described above, the SPAD pixel 21 prevents (or alternatively, reduces) the generation of crosstalk and improves the sensitivity of the SPAD element 31, thereby enhancing the characteristics of the pixel.

(Second Configuration Example of SPAD Pixel)

Figure 4:
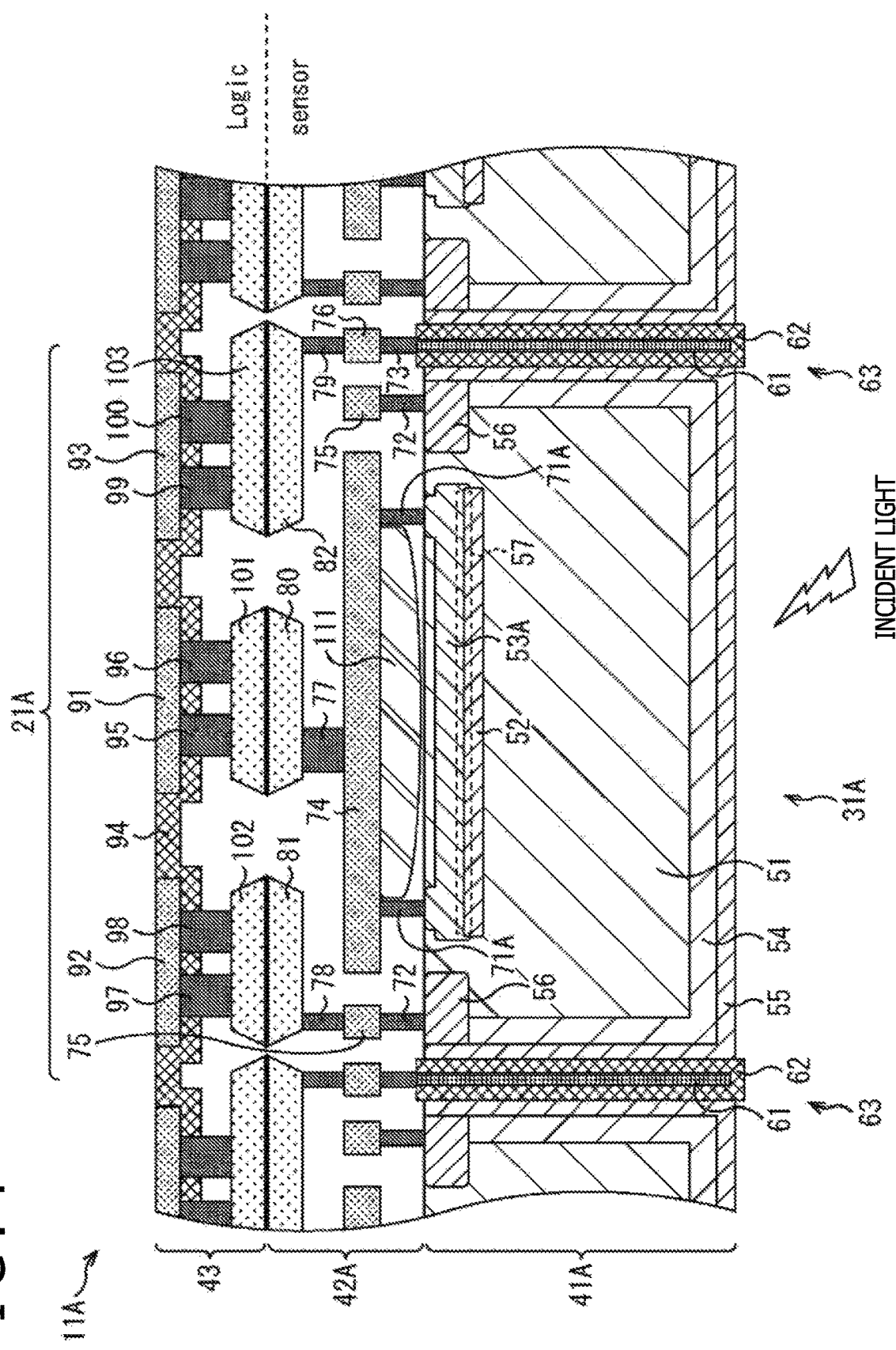
FIG. 4 is a schematic diagram depicting a second configuration example of a SPAD pixel as viewed cross-sectionally.
Figure 5:
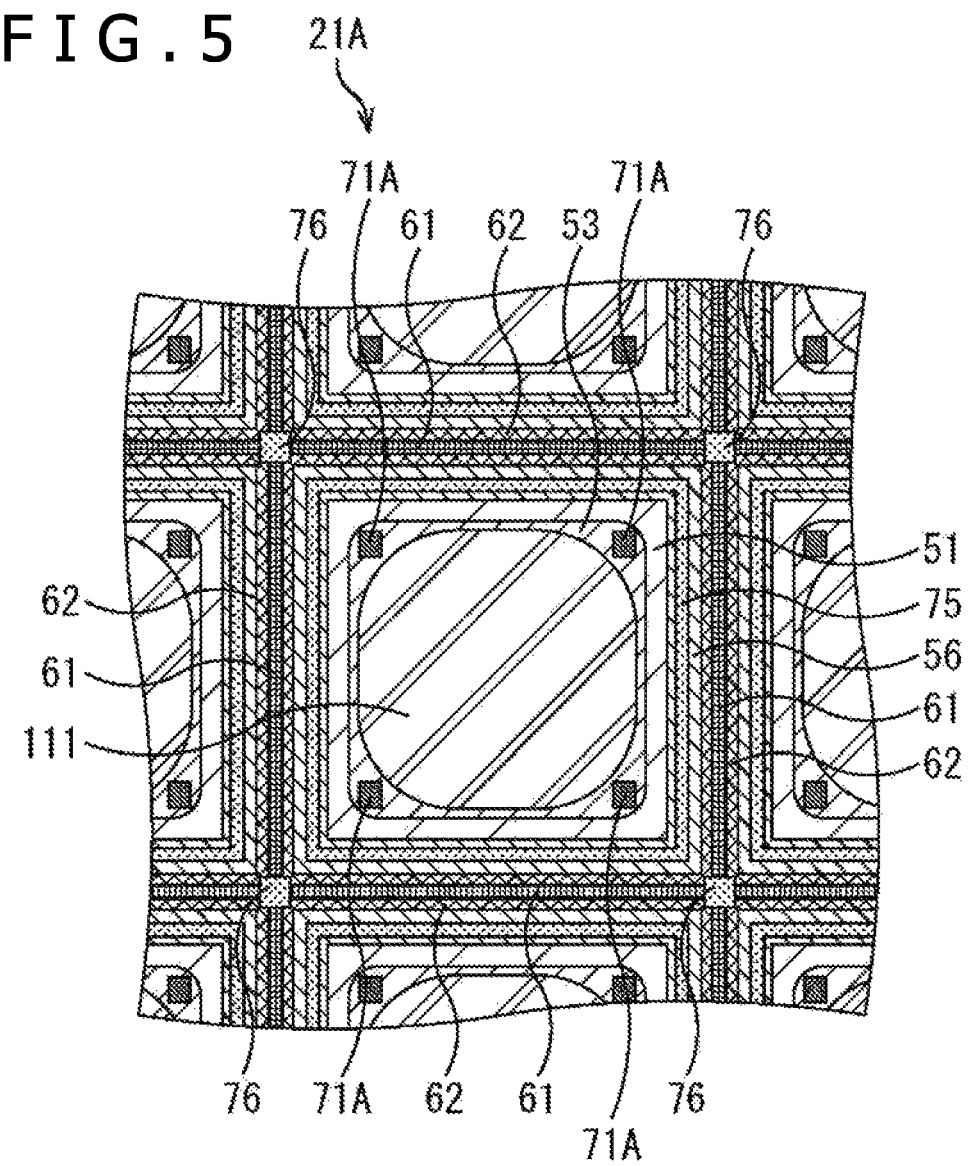
FIG. 5 is a schematic diagram depicting the second configuration example of the SPAD pixel as viewed two-dimensionally in a wiring layer.

Described below with reference to FIGS. 4 and 5 is a sensor chip 11A in which a SPAD pixel 21A as a second configuration example is formed. FIG. 4 depicts the configuration example of the SPAD pixel 21A as viewed cross-sectionally. FIG. 5 depicts the configuration example of the SPAD pixel 21A as viewed two-dimensionally in the wiring layer. In the sensor chip 11A and the SPAD pixel 21A depicted in FIGS. 4 and 5, the components substantially the same as those in the sensor chip 11 and the SPAD pixel 21 in FIGS. 2 and 3 are designated by the same reference symbols, and their detailed explanations are omitted hereunder.

As depicted in FIG. 4, the SPAD pixel 21A of the sensor chip 11A is structurally different from the SPAD pixel 21 of the sensor chip 11 in FIG. 2 in that an inner lens 111 is disposed in a sensor-side wiring layer 42A.

The inner lens 111, disposed between a sensor substrate 41A and the metal wiring 74, is a projected condensing lens bulging toward the sensor substrate 41A. For example, the inner lens 111 is formed to condense the light reflected by the metal wiring 74 onto the center the SPAD element 31A.

In the SPAD pixel 21A, four contact electrodes 71A are disposed in four corners outside the inner lens 111 as depicted in FIG. 5 to provide connection between an N-type diffusion layer 53A and the metal wiring 74 in a manner bypassing the inner lens 111. The N-type diffusion layer 53A disposed in the SPAD element 31A of the sensor substrate 41A in a manner corresponding to the positions of the contact electrode 71A is formed partially to have protrusions reaching the surface of the sensor substrate 41.

The SPAD pixel 21A is configured as described above. For example, slightly oblique incident light transmitted through the SPAD element 31A and reflected by the metal wiring 74 is condensed by the inner lens 111 onto the center of the SPAD element 31A. The SPAD pixel 21A thus improves its condensing efficiency using the inner lens 111. This prevents (or alternatively, reduces) the generation of crosstalk, improves the sensitivity of the SPAD element 31A, and thereby enhances the characteristics of the pixel.

(Third Configuration Example of SPAD Pixel)

Figure 6:
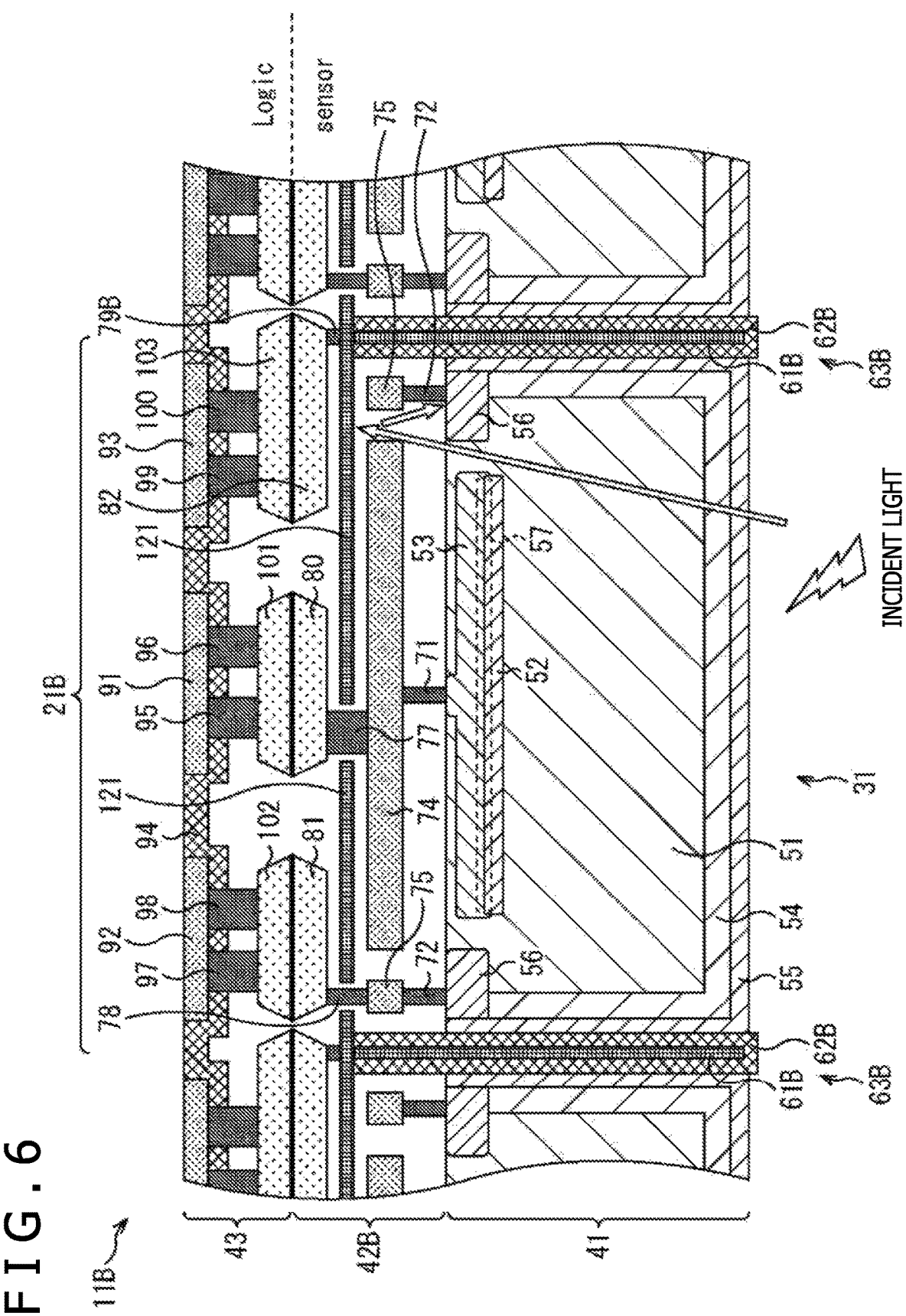
FIG. 6 is a schematic diagram depicting a third configuration example of a SPAD pixel as viewed cross-sectionally.
Figure 7:
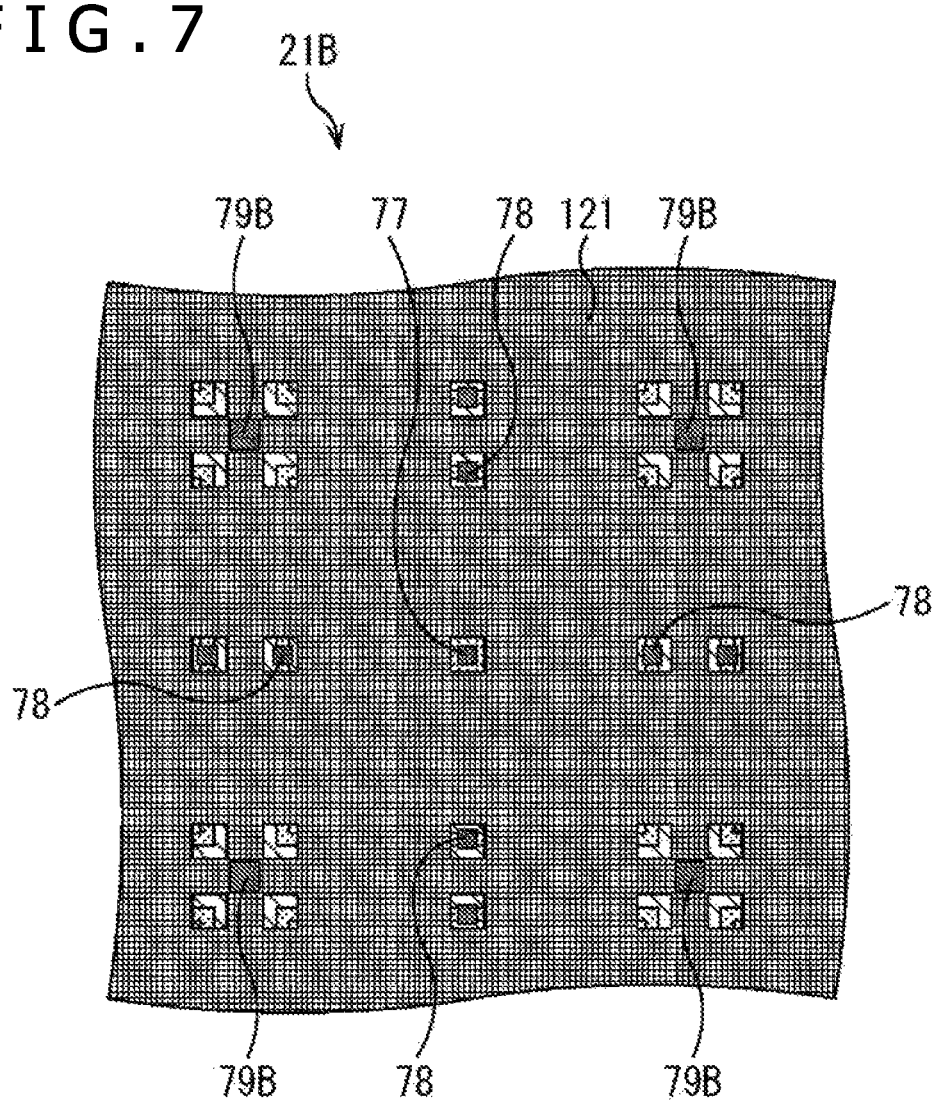
FIG. 7 is a schematic diagram depicting the third configuration example of the SPAD pixel as viewed two-dimensionally in a wiring layer.

Described below with reference to FIGS. 6 and 7 is a sensor chip 11B in which a SPAD pixel 21B as a third configuration example is formed. FIG. 6 depicts the configuration example of the SPAD pixel 21B as viewed cross-sectionally. FIG. 7 depicts the configuration example of the SPAD pixel 21B as viewed two-dimensionally in the wiring layer. In the sensor chip 11B and the SPAD pixel 21B depicted in FIGS. 6 and 7, the components substantially the same as those in the sensor chip 11 and the SPAD pixel 21 in FIGS. 2 and 3 are designated by the same reference symbols, and their detailed explanations are omitted hereunder.

As depicted in FIG. 6, the SPAD pixel 21B of the sensor chip 11B is structurally different from the SPAD pixel 21 of the sensor chip 11 in FIG. 2 in that a light shielding film 121 is disposed in a sensor-side wiring layer 42B.

The light shielding film 121, disposed between the metal wiring 74 and 75 on the one hand and the metal pads 80 to 82 on the other hand, shields the light transmitted through the gap between the metal wiring 74 and 75. As depicted in FIG. 7, the light shielding film 121 has openings through which the contact electrodes 77 and 78 penetrate. Except for the openings, the light shielding film 121 is formed substantially over the entire pixel.

As with the metal film 61, for example, the light shielding film 121 may be formed by a light reflecting metal (e.g., tungsten). As indicated by hollow arrows in FIG. 6, the light shielding film 121 reflects the light transmitted through the SPAD element 31 and passing through the gap between the metal wiring 74 and 75.

A pixel-to-pixel isolation section 63B of the SPAD pixel 21B is configured in such a manner that a metal film 61B and an insulating film 62B penetrate the sensor substrate 41 and protrude toward a sensor-side wiring layer 42B to reach the light shielding film 121. The metal film 61B is connected electrically with the light shielding film 121. A contact electrode 79B is formed to provide connection between the metal pad 82 and the light shielding film 121. A bias voltage is applied to the metal film 61B via the light shielding film 121.

The SPAD pixel 21B is configured as described above. The metal film 61B and the light shielding film 121 are formed to cover a layer that has the metal wiring 74 and 75 formed therein. This allows the light transmitted through the SPAD element 31 to be reflected unfailingly. The SPAD pixel 21B thus prevents (or alternatively reduces) leaks of light to adjacent SPAD elements 31 using the metal film 61B and the light shielding film 121. This prevents (or alternatively, reduces) the generation of crosstalk, improves the sensitivity of the SPAD element 31A, and thereby enhances the characteristics of the pixel.

(Fourth Configuration Example of SPAD Pixel)

Figure 8:
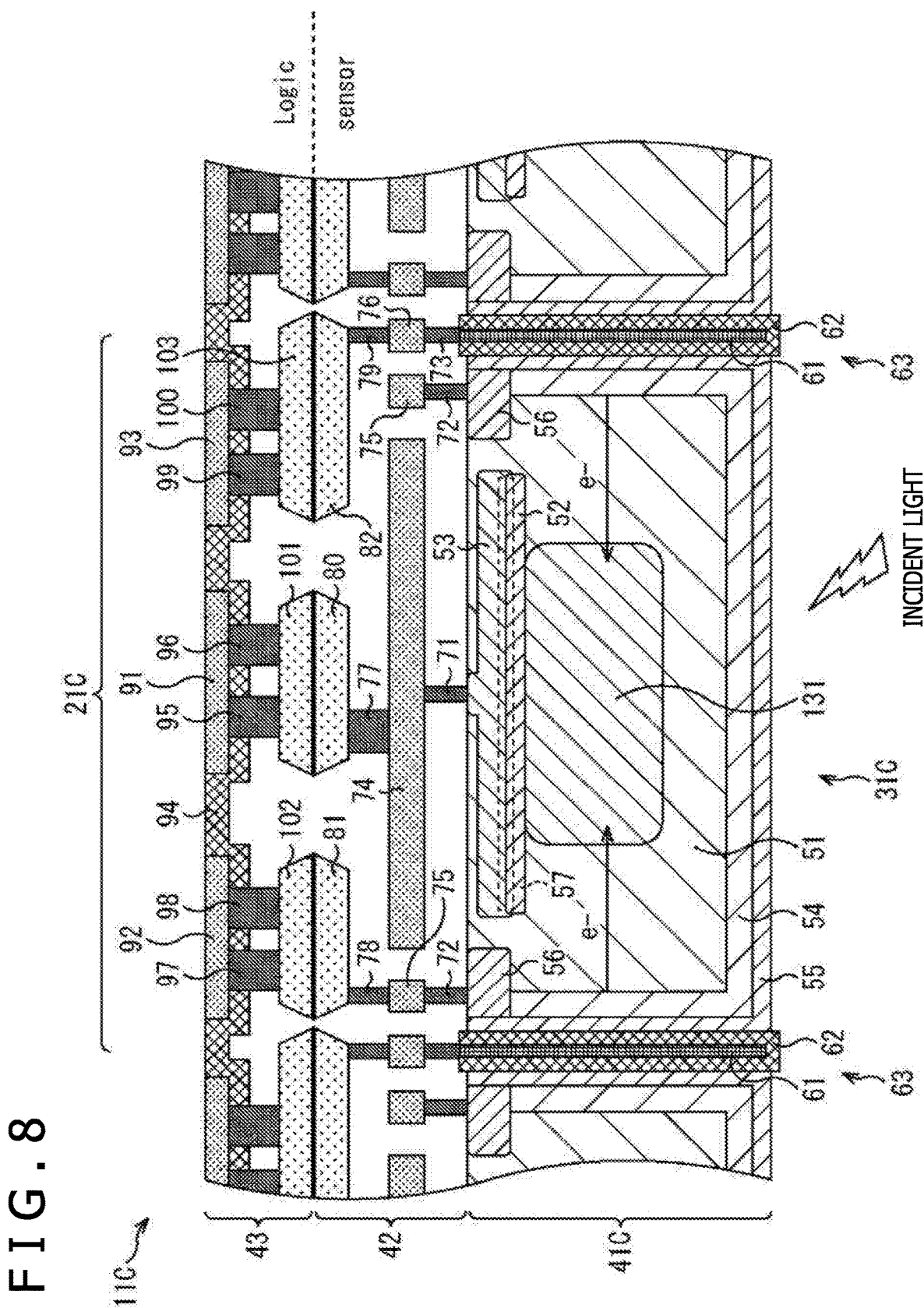
FIG. 8 is a schematic diagram depicting a fourth configuration example of a SPAD pixel as viewed cross-sectionally.

Described below with reference to FIG. 8 is a sensor chip 11C in which a SPAD pixel 21C as a fourth configuration example is formed. FIG. 8 depicts the configuration example of the SPAD pixel 21C as viewed cross-sectionally. In the sensor chip 11C and the SPAD pixel 21C depicted in FIG. 8, the components substantially the same as those in the sensor chip 11 and SPAD pixel 21 in FIG. 2 are designated by the same reference symbols, and their detailed explanations are omitted hereunder.

As depicted in FIG. 8, the SPAD pixel 21C of the sensor chip 11C is structurally different from the SPAD pixel 21 of the sensor chip 11 in FIG. 2 in that an N-type region 131 is disposed in a SPAD element 31C of a sensor substrate 41C.

The N-type region 131 is configured to be in contact with the P-type diffusion layer 52 at the center of the SPAD element 31C. For example, the N-type region 131 forms a potential gradient such as to let the carriers (electrons)

generated in the SPAD element 31C drift easily from the periphery to the center. That is, in the SPAD element 31C, N-type impurities are injected into the N-well 51 to form the N-type region 131 which, as an initially N-type region, produces an electrical field that attracts carriers.

Also in the SPAD element 31C, a bias voltage applied to the metal film 61 in the pixel-to-pixel isolation section 63 causes the hole accumulation layer 54 and the N-well 51 to be attracted to a potential induced by the bias voltage. This produces a stronger potential well. That in turn allows the SPAD element 31C to provide a stronger electrical field letting carriers drift toward the N-type region 131 than if the potential is not given. With carriers thus attracted to the N-type region 131 more easily, the SPAD element 31C allows electrons to reach the avalanche amplification region 57 more efficiently.

Made up of the metal film 61 and the insulating film 62, the pixel-to-pixel isolation section 63 provides a dual reflection structure. Alternatively, the hole accumulation layer 54 that accumulates holes may be induced in the periphery of the SPAD element 31C through adjustment of the bias voltage applied to the metal film 61.

The SPAD pixel 21C is configured as described above. For example, infinitesimal carriers generated by the light reflected by the metal film 61 are captured as a signal when the potential gradient in the N-type region 131 is reinforced by application of the bias voltage to the metal film 61. Thus the capture of such infinitesimal carriers allows the SPAD pixel 21C to enhance its sensitivity, which in turn improves the characteristic of the pixel.

(Fifth Configuration Example of SPAD Pixel)

Figure 9:
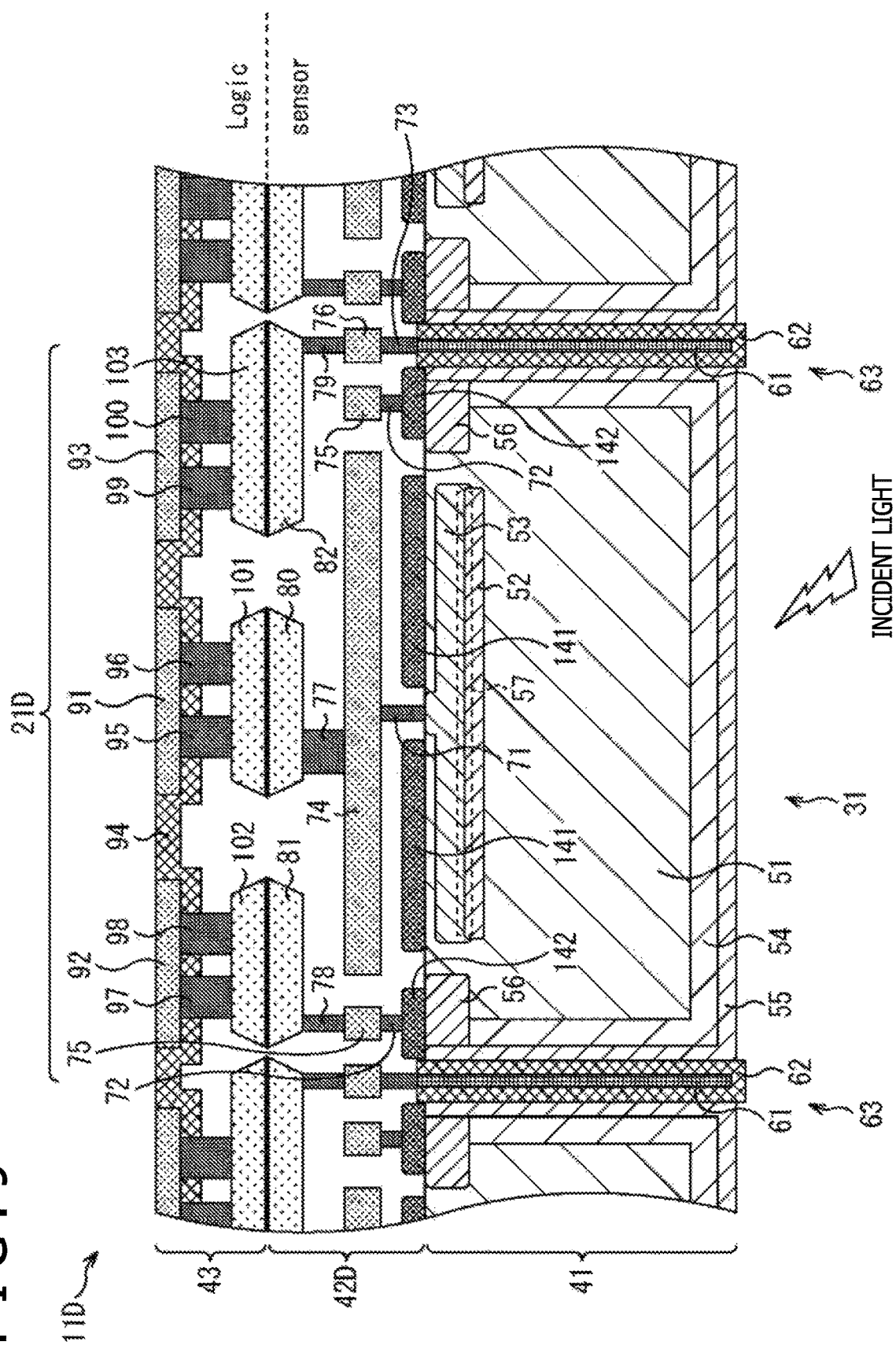
FIG. 9 is a schematic diagram depicting a fifth configuration example of a SPAD pixel as viewed cross-sectionally.
Figure 10:
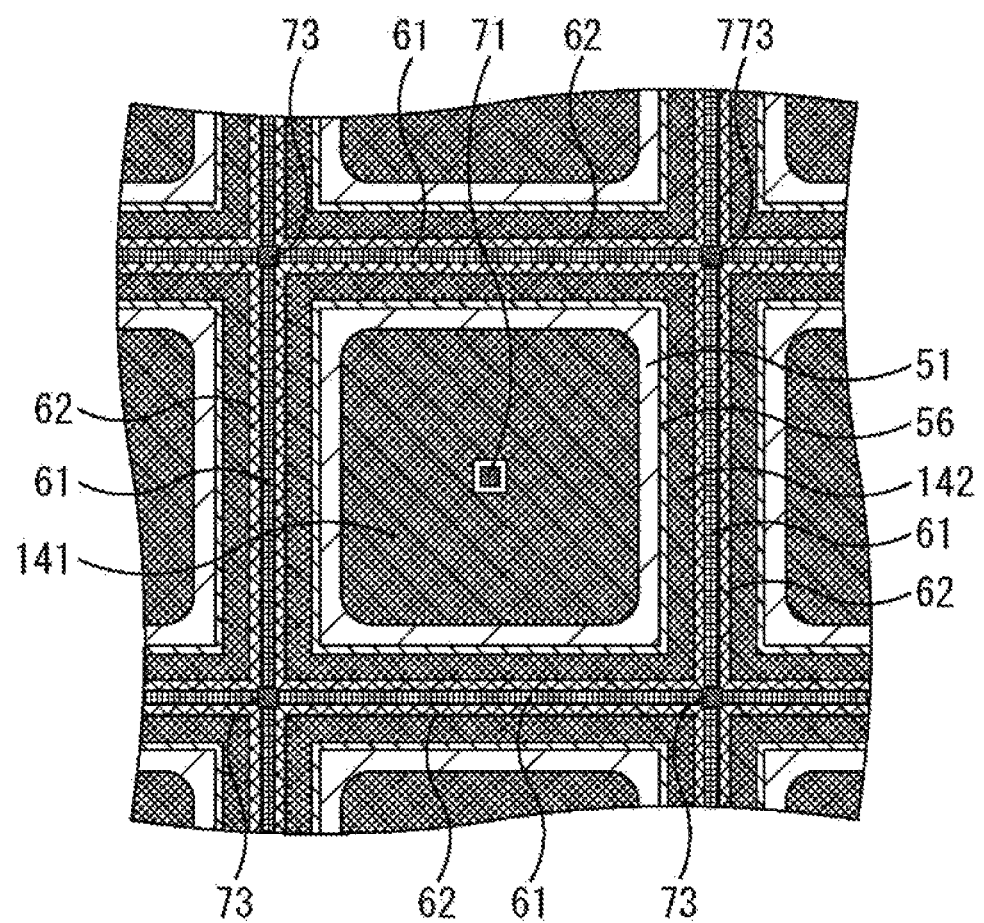
FIG. 10 is a schematic diagram depicting the fifth configuration example of the SPAD pixel as viewed two-dimensionally in a wiring layer.

Described below with reference to FIGS. 9 and 10 is a sensor chip 11D in which a SPAD pixel 21D as a fifth configuration example is formed. FIG. 9 depicts the configuration example of the SPAD pixel 21D as viewed cross-sectionally. FIG. 10 depicts the configuration example of the SPAD pixel 21D as viewed two-dimensionally in the wiring layer. In the sensor chip 11D and the SPAD pixel 21D depicted in FIGS. 9 and 10, the components substantially the same as those in the sensor chip 11 and the SPAD pixel 21 in FIGS. 2 and 3 are designated by the same reference symbols, and their detailed explanations are omitted hereunder.

As depicted in FIGS. 9 and 10, the SPAD pixel 21D of the sensor chip 11D is structurally different from the SPAD pixel 21 of the sensor chip 11 in FIGS. 2 and 3 in that reflective films 141 and 142 are disposed in a sensor-side wiring layer 42D.

The reflective films 141 and 142 are formed over the surface of the sensor substrate 41, for example. The reflective films 141 and 142 are each a polysilicon film used as the gate electrode of a transistor and provide light reflecting characteristics. Preferably, the reflective film 141 is formed to be wider than the avalanche amplification region 57 in a manner at least covering it two-dimensionally as depicted in FIG. 10. That is, the reflective film 141 is formed to overlap with the metal wiring 74 when viewed two-dimensionally.

The SPAD pixel 21D is configured as described above. The light transmitted through the SPAD element 31 is reflected by the reflective films 141 and 142 disposed closer to the sensor substrate 41 than to the metal wiring 74. This reduces the light transmitted to the sensor-side wiring layer 42D. The SPAD pixel 21D thus encloses light efficiently using the reflective films 141 and 142. This prevents (or alternatively, reduces) the generation of crosstalk, improves the sensitivity of the SPAD element 31, and thereby enhances the characteristics of the pixel.

(Sixth Configuration Example of SPAD Pixel)

Figure 11:
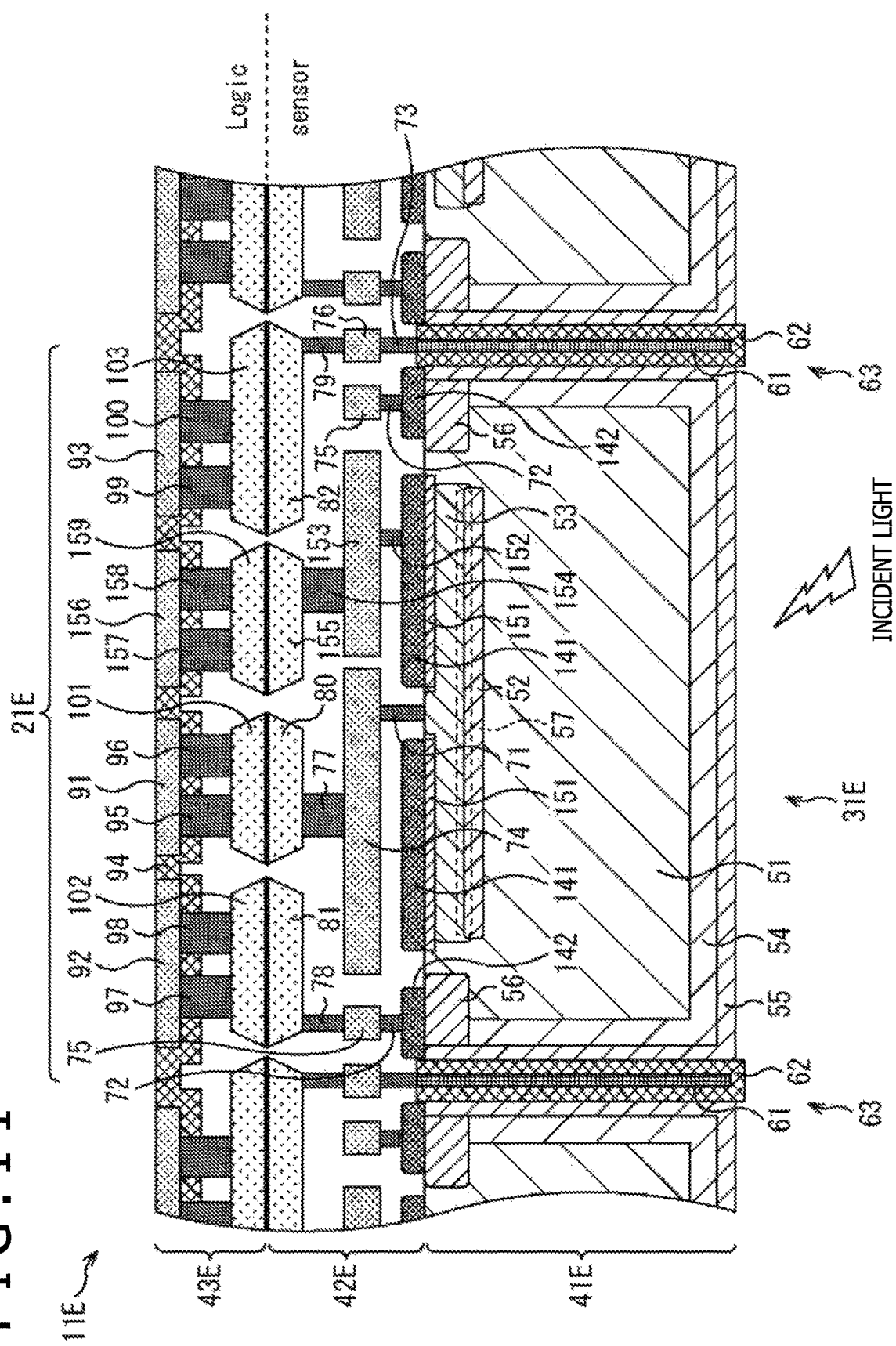
FIG. 11 is a schematic diagram depicting a sixth configuration example of a SPAD pixel as viewed cross-sectionally.

Described below with reference to FIG. 11 is a sensor chip 11E in which a SPAD pixel 21E as a sixth configuration example is formed. FIG. 11 depicts the configuration example of the SPAD pixel 21E as viewed cross-sectionally. In the sensor chip 11E and the SPAD pixel 21E depicted in FIG. 11, the components substantially the same as those in the sensor chip 11 and the SPAD pixel 21 in FIG. 2 are designated by the same reference symbols, and their detailed explanations are omitted hereunder.

As depicted in FIG. 11, the SPAD pixel 21E of the sensor chip 11E is structurally different from the SPAD pixel 21 of the sensor chip 11 in FIG. 2 in that a hole accumulation layer 151 is formed over the surface of a sensor substrate 41E.

In the SPAD pixel 21E, the reflective films 141 and 142 are disposed in substantially the same manner as in the SPAD pixel 21D depicted in FIG. 10. Wires for applying the bias voltage to the reflective film 141 are formed in a sensor-side wiring layer 42E and in a logic-side wiring layer 43E.

That is, the sensor-side wiring layer 42E has a contact electrode 152, metal wiring 153, a contact electrode 154, and a metal pad 155 formed therein and connected with one another. The contact electrode 152 is connected with the reflective film 141. The logic-side wiring layer 43E has an electrode pad 156, contact electrodes 157 and 158, and a metal pad 159 formed therein and connected with one another. The metal pad 159 and the metal pad 155 are bonded together.

Thus in the SPAD pixel 21E, the bias voltage fed to the electrode pad 156 is applied to the reflective film 141. This produces the hole accumulation layer 151 accumulating holes between the reflective film 141 and the N-type diffusion layer 53 over the surface of the sensor substrate 41E.

The SPAD pixel 21E is configured as described above. The light transmitted through the SPAD element 31E is reflected by the reflective films 141 and 142. At the same time, the hole accumulation layer 151 suppresses a dark current in a manner avoiding exposure to the surface of the avalanche amplification region 57. The SPAD pixel 21E thus prevents (or alternatively, reduces) the generation of crosstalk, improves the sensitivity of the SPAD element 31 and suppresses the dark current, which enhances the characteristics of the pixel.

(Seventh Configuration Example of SPAD Pixel)

Figure 12:
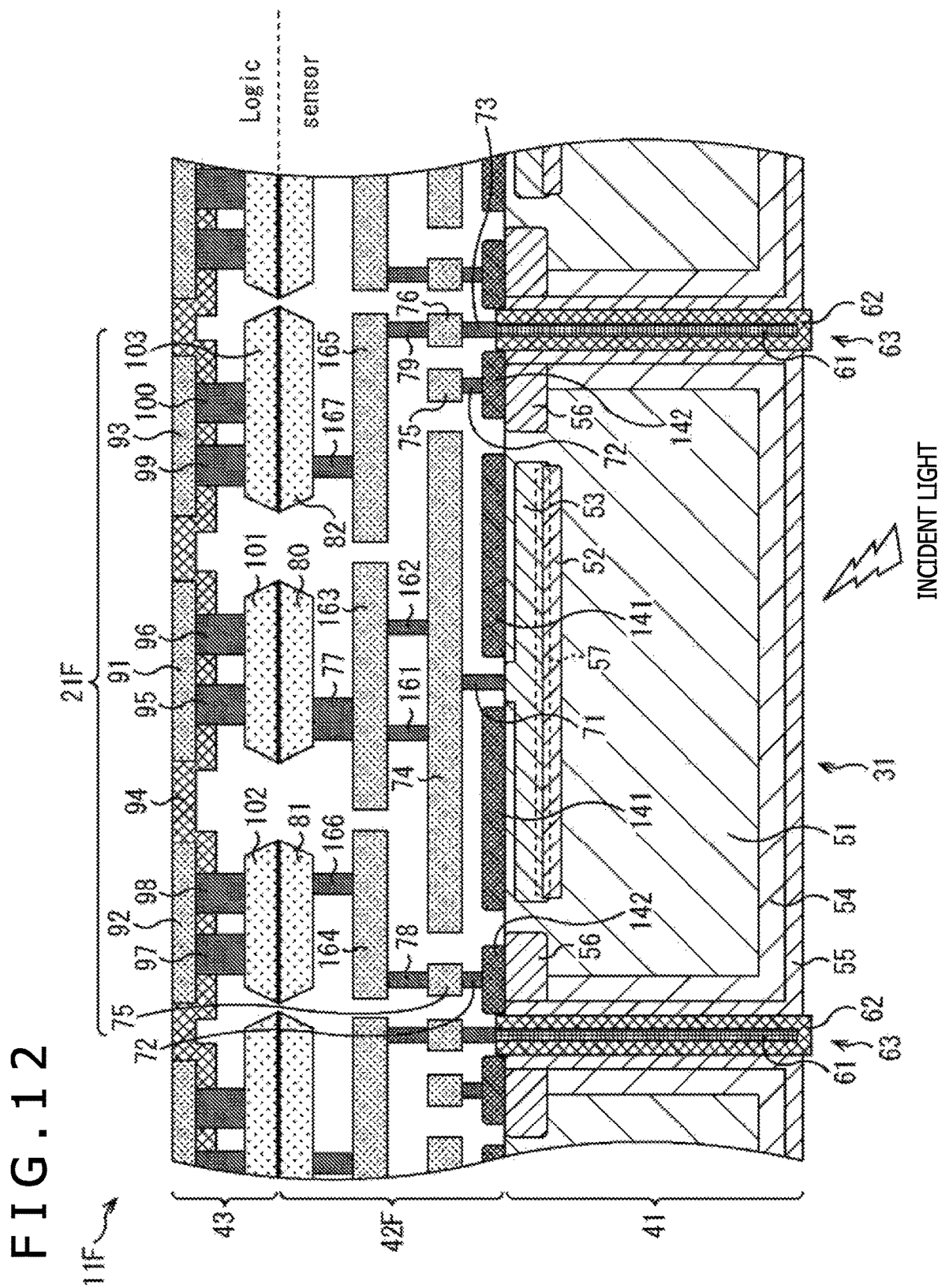
FIG. 12 is a schematic diagram depicting a seventh configuration example of a SPAD pixel as viewed cross-sectionally.

Described below with reference to FIG. 12 is a sensor chip 11F in which a SPAD pixel 21F as a seventh configuration example is formed. FIG. 12 depicts the configuration example of the SPAD pixel 21F as viewed cross-sectionally. In the sensor chip 11F and the SPAD pixel 21F depicted in FIG. 12, the components substantially the same as those in the sensor chip 11 and the SPAD pixel 21 in FIG. 2 are designated by the same reference symbols, and their detailed explanations are omitted hereunder.

As depicted in FIG. 12, the SPAD pixel 21F of the sensor chip 11F is structurally different from the SPAD pixel 21 of the sensor chip 11 in FIG. 2 in that a sensor-side wiring layer 42F has a two-layer wiring structure.

That is, the sensor-side wiring layer 42 of the sensor chip 11 in FIG. 2 has a one-layer wiring structure with the metal wiring 74 to 76 disposed therein. By contrast, the sensor-side wiring layer 42F of the sensor chip 11F constitutes a two-layer wiring structure having the metal wiring 74 to 76 and metal wiring 163 to 165 stacked therein. Alternatively, a multilayer wiring structure other than the two-layer structure may be adopted.

The metal wiring 74 to 76 and the metal wiring 163 to 165 are configured in such a manner that the gap between the metal wiring 74 to 76 and the gap between the metal wiring 163 to 165 do not overlap with one another as viewed two-dimensionally. That is, the metal wiring 74 to 76 and the metal wiring 163 to 165 are stacked alternately.

As with the SPAD pixel 21D in FIG. 9, the SPAD pixel 21F has the reflective films 141 and 142 stacked over the surface of the sensor substrate 41.

Also formed in the sensor-side wiring layer 42F of the sensor chip 11F are contact electrodes 161 and 162 for connecting the metal wiring 74 with the metal wiring 163, a contact electrode 166 for connecting the metal pad 81 with the metal wiring 164, and a contact electrode 167 for connecting the metal pad 82 with the metal wiring 165.

The SPAD pixel 21F is configured as described above. The light transmitted through the SPAD element 31 is reflected by reflectors (i.e., metal wiring 74 to 76, metal wiring 163 to 165, and reflective films 141 and 142) layered in the sensor-side wiring layer 42F in a manner covering the avalanche amplification region 57. With this configuration, the SPAD pixel 21F suppresses diffraction and diffuse reflection of the light transmitted through the SPAD element 31. This prevents (or alternatively, reduces) the generation of crosstalk, improves the sensitivity of the SPAD element 31, and thereby enhances the characteristics of the pixel.

(Eighth Configuration Example of SPAD Pixel)

Figure 13:
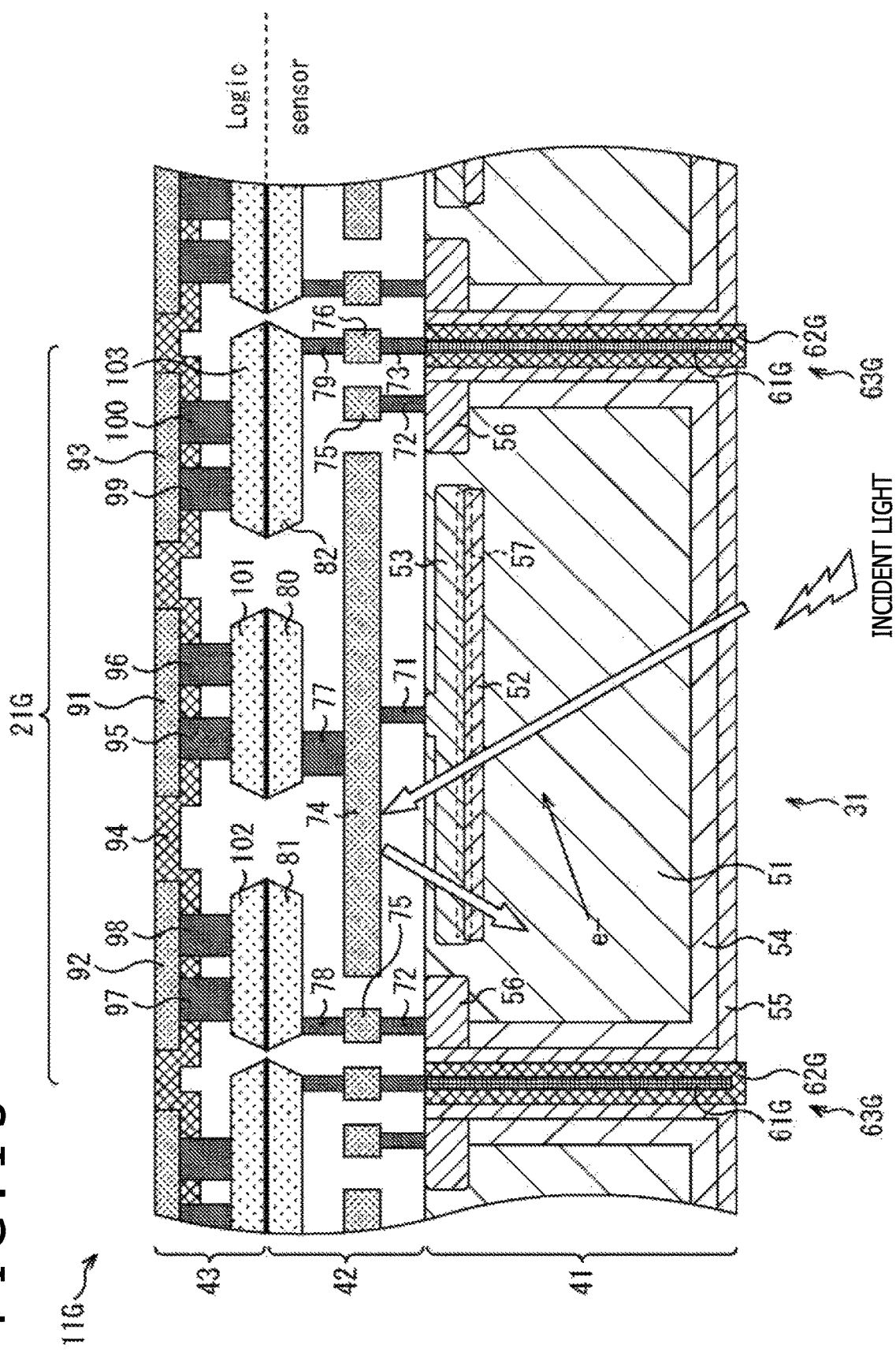
FIG. 13 is a schematic diagram depicting an eighth configuration example of a SPAD pixel as viewed cross-sectionally.

Described below with reference to FIG. 13 is a sensor chip 11G in which a SPAD pixel 21G as an eighth configuration example is formed. FIG. 13 depicts the configuration example of the SPAD pixel 21G as viewed cross-sectionally. In the sensor chip 11G and the SPAD pixel 21G depicted in FIG. 13, the components substantially the same as those in the sensor chip 11 and the SPAD pixel 21 in FIG. 2 are designated by the same reference symbols, and their detailed explanations are omitted hereunder.

As depicted in FIG. 13, the SPAD pixel 21G of the sensor chip 11G is structurally different from the SPAD pixel 21 of the sensor chip 11 in FIG. 2 in that a pixel-to-pixel isolation section 63G is formed so that its top is flush with the surface (bulk surface) of the sensor substrate 41.

In the SPAD pixel 21 of FIG. 2, for example, the pixel-to-pixel isolation section 63 is formed to protrude a little from the surface of the sensor substrate 41 into the sensor-side wiring layer 42. In the SPAD pixel 21G, by contrast, a metal layer 61G and an insulating film 62G making up the pixel-to-pixel isolation section 63G are formed in such a manner that their tops are flush with the surface of the sensor substrate 41.

As described above, the pixel-to-pixel isolation section 63G may be reduced in height so that its top is flush with the surface of the sensor substrate 41, as long as the pixel-to-pixel isolation section 63G with its reduced height can sufficiently suppress the generation of crosstalk. That is, there is no need to form the pixel-to-pixel isolation section 63 in a manner protruding from the surface of the sensor substrate 41 into the sensor-side wiring layer 42.

In the SPAD pixel 21G configured as described above, the light transmitted through the SPAD element 31 is reflected by the metal wiring 74. This prevents (or alternatively, reduces) the generation of crosstalk, improves the sensitivity of the SPAD element 31, and thereby enhances the characteristics of the pixel.

Alternatively, the configuration in which the top of the pixel-to-pixel isolation section 63G is made to be flush with the surface of the sensor substrate 41, as in the SPAD pixel 21G, may be combined with any of the above-described configurations of the SPAD pixels 21A to 21F.

(Configuration Examples of Imaging Device)

Figure 14:
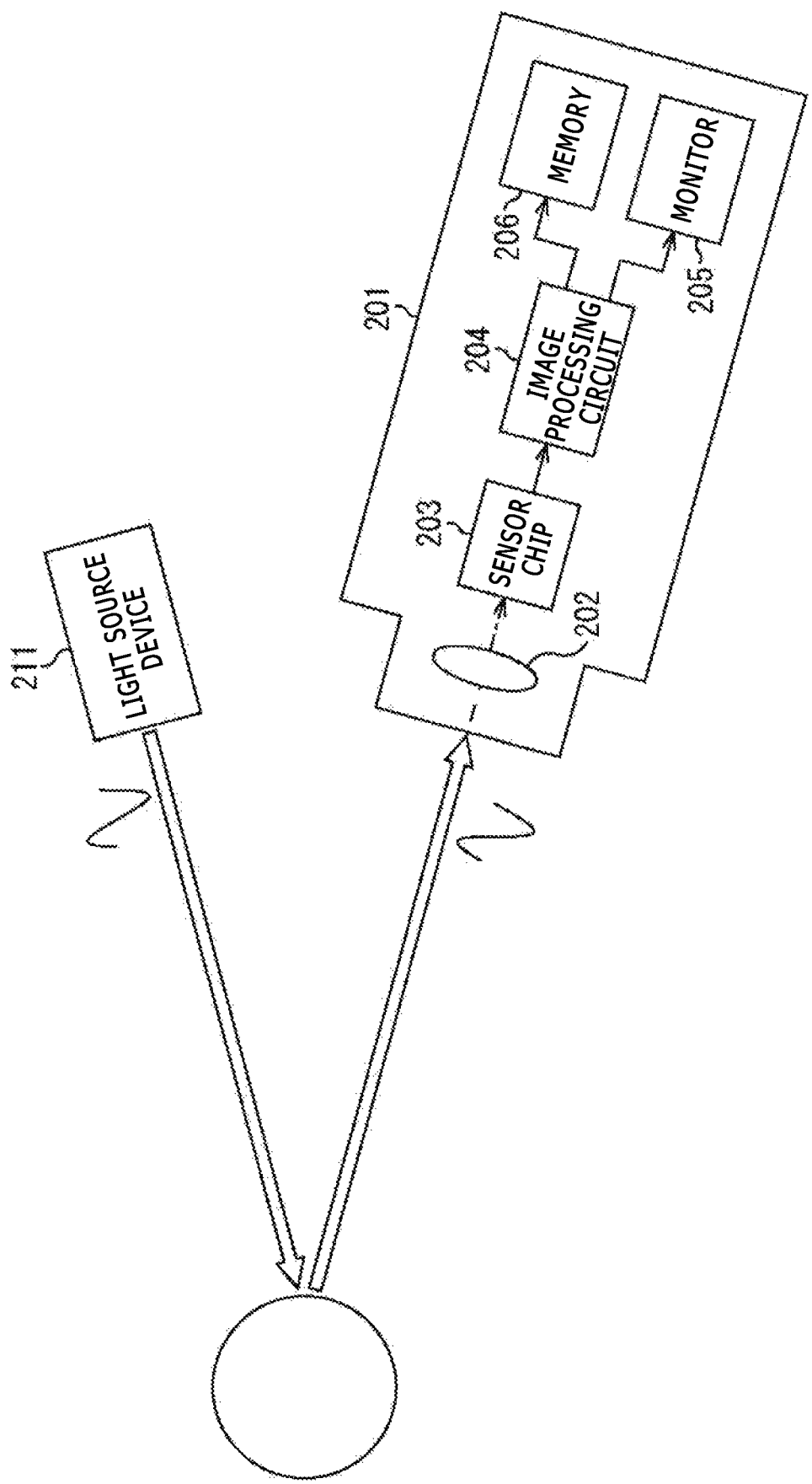
FIG. 14 is a block diagram depicting a typical configuration of a distance image sensor.

FIG. 14 is a block diagram depicting a typical configuration of a distance image sensor as an electronic device that uses the sensor chip 11.

As depicted in FIG. 14, a distance image sensor 201 is configured to include an optical system 202, a sensor chip 203, an image processing circuit 204, a monitor 205, and a memory 206. The distance image sensor 201 acquires a distance image corresponding to the distance to an object by receiving the light (modulated or pulsed radiation) projected by a light source device 211 to the object and reflected by the surface of the object.

The optical system 202 is configured to include one or multiple lenses. The optical system 202 guides image light (incident light) from the object to the sensor chip 203 so that an image may be formed on a light-receiving surface (sensor section) of the sensor chip 203.

The sensor chip 11 in each of the above-described embodiments may be adopted as the sensor chip 203. The image processing circuit 204 is supplied with a distance signal indicative of the distance obtained from the light-receiving signal (APD OUT) output from the sensor chip 203.

The image processing circuit 204 performs an imaging process to create the distance image based on the distance signal supplied from the sensor chip 203. The distance image (image data) obtained by the imaging process is sent to the monitor 205 for display and fed to the memory 206 for storage (recording).

The distance image sensor 201 thus configured uses the above-described sensor chip 11 to acquire more accurate distance images, for example, thanks to the improved characteristics of the SPAD pixel 21.

(Usage Examples of Image Sensor)

Figure 15:
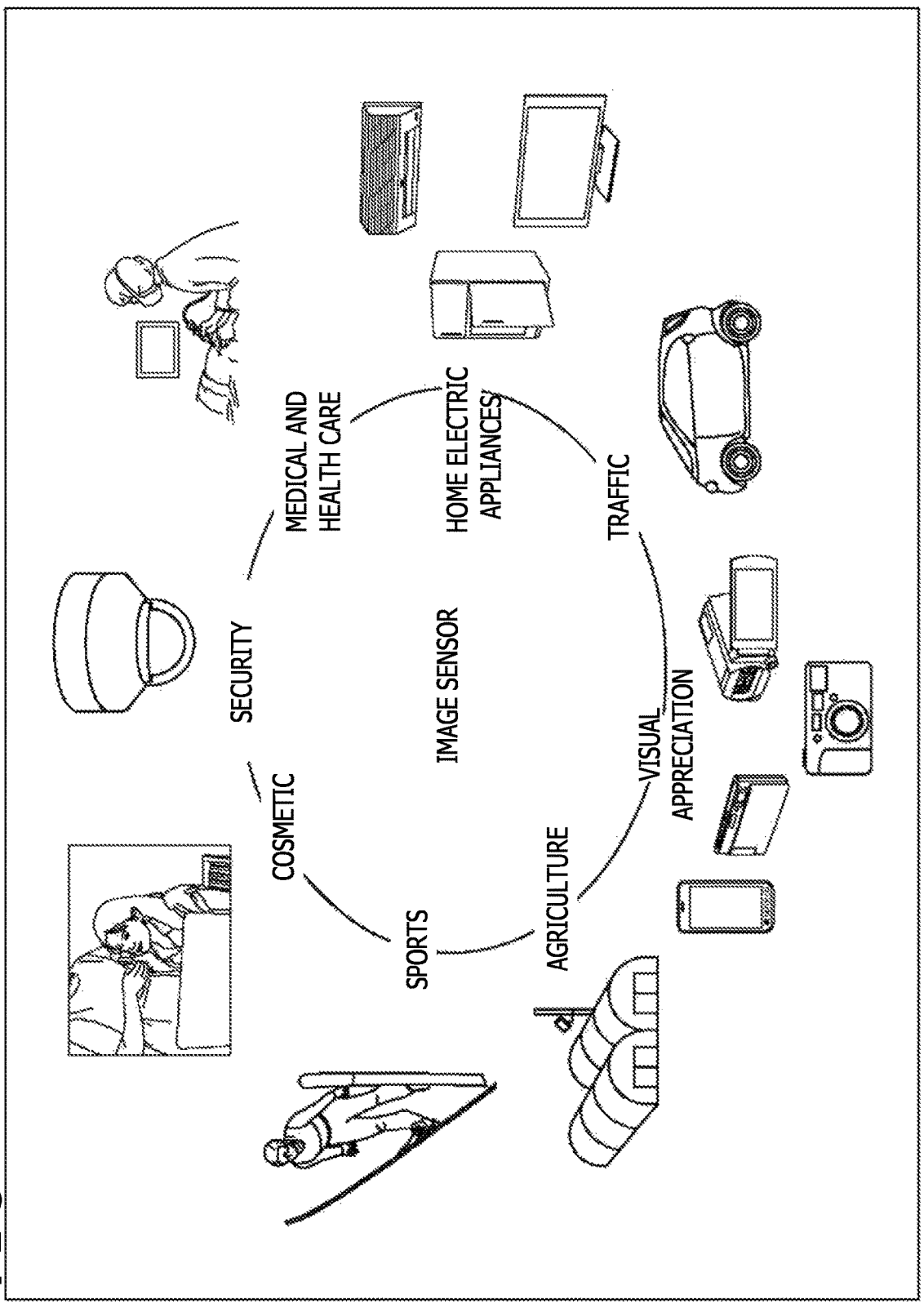
FIG. 15 is a schematic diagram depicting examples of how image sensors are used.

FIG. 15 is a schematic diagram depicting examples of how the above-described image sensor (distance image sensor) is used.

The image sensor discussed above may be used in various cases outlined below, such as where diverse types of light including visible radiation, infrared radiation, ultraviolet radiation, and X-radiation are sensed by the image sensor.

- Devices that capture images for visual appreciation, such as digital cameras and camera function-equipped mobile devices.
- Traffic use devices including onboard sensors that capture images of the front side, rear side, surroundings, and interior of a vehicle to ensure safe operations such as automated vehicle stop and to recognize the driver's status; surveillance cameras for monitoring passing vehicles and the roads on which they travel; and distance measurement sensors for measuring the distance between vehicles.
- Devices that capture images of user's gestures to operate home electric appliances such as television (TV) sets, refrigerators, and air conditioners in a manner reflecting the gestures.
- Devices for medicine and health care uses, such as endoscopes and instruments that capture images of blood vessels using received infrared radiation.
- Devices for security uses, such as surveillance cameras for crime prevention and cameras for personal authentication.
- Devices for cosmetic uses, such as skin measuring instruments and microscopes for capturing images of the scalp.

Devices for sports uses, such as action cameras and wearable cameras for sporting use.

Devices for agriculture uses, such as surveillance cameras for monitoring fields and crops.

The present technology may be configured preferably as follows.

(1)

An imaging device, comprising:
a sensor substrate including a pixel array that includes at least a first pixel, the first pixel including:
an avalanche photodiode including a light receiving region, a cathode, and an anode; and
a wiring layer electrically connected to the cathode and arranged in the sensor substrate such that the wiring layer is in a path of incident light that exits the light receiving region.

(2)

The imaging device of (1), wherein the sensor substrate further comprises:
an isolation section at a peripheral area of the first pixel to isolate the first pixel from at least a second pixel that is adjacent to the first pixel.

(3)

The imaging device of (2), wherein the isolation section further comprises:
an insulating material that electrically isolates the first pixel from the second pixel; and
a reflective material that reflects light incident to the peripheral area toward the light receiving area.

(4)

The imaging device of (3), wherein the isolation section is in a trench of the sensor substrate, and wherein the insulating material surrounds the reflective material in the trench.

(5)

The imaging device of (4), wherein the reflective material is conductive.

(6)

The imaging device of (2), further comprising:
a logic substrate including one or more first conductive pads bonded to one or more second conductive pads of the sensor substrate.

(7)

The imaging device of (6), wherein the one or more second conductive pads includes:
a first conductive pad electrically connected to the anode;
a second conductive pad electrically connected to the wiring layer; and
a third conductive pad electrically connected to the isolation section and configured to apply a bias voltage from the logic substrate to the isolation section.

(8)

The imaging device of (6), wherein the sensor substrate further comprises:
a light shielding film between the wiring layer and the one or more second conductive pads.

(9)

The imaging device of (8), wherein the light shielding film includes a portion that is electrically connected to the isolation section.

(10)

The imaging device of (2), wherein the sensor substrate further comprises:
a lens arranged between the light receiving region and the wiring layer.

(11)

The imaging device of (2), wherein the sensor substrate further comprises:
a reflective film between the light receiving region and the wiring layer.

(12)

The imaging device of (2), wherein, in a plan view, the isolation section forms a grid pattern to isolate the first pixel from the second pixel and other surrounding pixels.

(13)

The imaging device of claim 12), wherein, in the plan view, the wiring layer is in a central portion of the first pixel and covers the cathode.

(14)

An imaging device, comprising:
a logic substrate for processing image signals;
a sensor substrate including at least a first pixel, the first pixel including:
an avalanche photodiode that includes a light receiving region, a cathode, and an anode; and
a wiring layer electrically connected to the cathode and between the light receiving region and the logic substrate such that the wiring layer is in a path of incident light that exits the light receiving region; and
a bonding section that electrically connects the sensor substrate to the logic substrate.

(15)

The imaging device of (14), wherein the sensor substrate further comprises:
an isolation section that isolates the first avalanche photodiode from at least a second pixel that is adjacent to the first pixel.

(16)

The imaging device of (15), wherein the bonding section comprises:
one or more first conductive pads of the logic substrate bonded to one or more second conductive pads of the sensor substrate.

(17)

The imaging device of (16), wherein the one or more second conductive pads includes:
a first conductive pad electrically connected to the anode;
a second conductive pad electrically connected to the wiring layer; and
a third conductive pad electrically connected to the isolation section.

(18)

The imaging device of (17), wherein the third conductive pad is configured to apply a bias voltage received from the logic substrate to the isolation section.

(19)

The imaging device of (15), wherein sensor substrate further comprises at least one of:
a light shielding film between the wiring layer and the logic substrate;
a lens between the light receiving region and the wiring layer; and
a reflective film between the light receiving region and the wiring layer.

(20)

An imaging device, comprising:
a sensor substrate including at least a first pixel, the first pixel including:

an avalanche photodiode that includes a light receiving region, a cathode, and an anode; and
a wiring layer electrically connected to the cathode;
an isolation section to isolate the first pixel from a second pixel that is adjacent to the first pixel; and
a plurality of conductive pads for bonding the sensor substrate to a logic substrate, the plurality of conductive pads including:
a first conductive pad electrically connected to the anode;
a second conductive pad electrically connected to the wiring layer; and
a third conductive pad electrically connected to the isolation section.

(21)

A sensor chip including:
a pixel array section configured to have multiple pixels arrayed therein;
an avalanche photodiode element configured to amplify carriers using a high electrical field region provided for each of the pixels;
a pixel-to-pixel isolation section configured to isolate adjacent pixels from each other in a semiconductor substrate having the avalanche photodiode element formed therein; and
metal wiring configured to be disposed in a wiring layer stacked on a surface of the semiconductor substrate opposite a light-receiving surface thereof, the metal wiring covering at least the high electrical field region.

(22)

The sensor chip as stated in paragraph (21) above, further including:
an inner lens configured to be disposed between the metal wiring and the semiconductor substrate in a manner condensing light transmitted through the avalanche photodiode element and reflected by the metal wiring onto center of the avalanche photodiode element.

(23)

The sensor chip as stated in paragraph (21) or (22) above, in which the pixel-to-pixel isolation section is configured to penetrate from a back of the semiconductor substrate to the surface thereof.

(24)

The sensor chip as stated in any one of paragraphs (21) to (23) above, in which the pixel-to-pixel isolation section is configured to have a dual structure made up of a metal film that reflects light and an insulating film that provides insulation, the pixel-to-pixel isolation section being embedded in the semiconductor substrate in such a manner that a surface of the metal film is covered with the insulating film.

(25)

The sensor chip as stated in any one of paragraphs (21) to (24) above, in which a voltage is applied to the metal film embedded in the semiconductor substrate as the pixel-to-pixel isolation section, the voltage inducing a hole accumulation layer that accumulates holes in periphery of the avalanche photodiode element.

(26)

The sensor chip as stated in any one of paragraphs (21) to (25) above, in which a voltage is applied to the metal film embedded in the semiconductor substrate as the pixel-to-pixel isolation section, the voltage reinforcing an electrical field that allows carriers to drift.

(27)

The sensor chip as stated in any one of paragraphs (21) to (26) above, in which a reflective film configured to reflect light is formed over the surface of the semiconductor substrate in a manner covering at least the high electrical field region.

(28)

The sensor chip as stated in paragraph (27) above, in which a voltage is applied to the reflective film to form a hole accumulation layer that accumulates holes near the surface of the semiconductor substrate.

(29)

The sensor chip as stated in paragraph (27) or (28) above, in which the reflective film is configured to overlap with the metal wiring when viewed two-dimensionally.

(30)

The sensor chip as stated in any one of paragraphs (21) to (29) above, in which the pixel-to-pixel isolation section is configured in such a manner that the top thereof is substantially flush with the surface of the semiconductor substrate.

(31)

An Electronic Device Including:
a sensor chip that includes
a pixel array section configured to have multiple pixels arrayed therein,
an avalanche photodiode element configured to amplify carriers using a high electrical field region provided for each of the pixels,
a pixel-to-pixel isolation section configured to isolate adjacent pixels from each other in a semiconductor substrate having the avalanche photodiode element formed therein, and
metal wiring configured to be disposed in a wiring layer stacked on a surface of the semiconductor substrate opposite a light-receiving surface thereof, the metal wiring covering at least the high electrical field region.

The present embodiments are not limited to the above-described embodiments that may be varied or modified diversely within the spirit and scope of the present disclosure.

REFERENCE SIGNS LIST

11 Sensor chip, 12 Pixel array section, 13 Bias voltage application section, 21 SPAD pixel, 31 SPAD element, 32 p-type MOSFET, 33 CMOS inverter, 41 Sensor substrate, 42 Sensor-side wiring layer, 43 Logic-side wiring layer, 51 N-well, 52 P-type diffusion layer, 53 N-type diffusion layer, 54 Hole accumulation layer, 55 Pinning layer, 56 High concentration P-type diffusion layer, 57 Avalanche amplification region, 61 Metal film, 62 Insulating film, 63 Pixel-to-pixel isolation section, 71 to 73 Contact electrodes, 74 to 76 Metal wiring, 77 to 79 Contact electrodes, 80 to 82 Metal pads, 91 to 93 Electrode pads, 94 Insulating layer, 95 to 100 Contact electrodes, 101 to 103 Metal pads

The invention claimed is:
1. A light detecting device, comprising:
a logic substrate for processing light detecting signals;
a sensor substrate including at least a first pixel, the first pixel including:
an avalanche photodiode that includes a light receiving region, a cathode, and an anode; and
a wiring layer including:
a first wiring electrically connected to one of the cathode or the anode and arranged in the sensor substrate such that the wiring layer is in a path of incident light that exits the light receiving region;
a second wiring electrically connected to the first wiring;

a third wiring electrically connected to the other of the cathode or the anode; and a fourth wiring electrically connected to the third wiring, wherein a bonding section including the second wiring and the fourth wiring electrically connects the sensor substrate to the logic substrate.

2. The light detecting device of claim 1, wherein the sensor substrate further comprises:

an isolation section that isolates the first pixel from at least a second pixel that is adjacent to the first pixel.

3. The light detecting device of claim 2, wherein the bonding section comprises:

a first section of wirings of the logic substrate bonded to a second section of wirings of the sensor substrate.

4. The light detecting device of claim 3, wherein the second section of wirings includes:

a fifth wiring electrically connected to the anode;

a sixth wiring electrically connected to the wiring layer; and a seventh wiring electrically connected to the isolation section.

5. The light detecting device of claim 4, wherein the seventh wiring is configured to apply a bias voltage received from the logic substrate to the isolation section.

6. The light detecting device of claim 2, wherein sensor substrate further comprises at least one of:

a light shielding film between the wiring layer and the logic substrate;

a lens between the light receiving region and the wiring layer; and a reflective film between the light receiving region and the wiring layer.

7. A light detecting device, comprising:

a sensor substrate including at least a first pixel, the first pixel including:

an avalanche photodiode that includes a light receiving region, a cathode, and an anode; and a first wiring electrically connected to the cathode;

an isolation section to isolate the first pixel from a second pixel that is adjacent to the first pixel; and a plurality of wirings for bonding the sensor substrate to a logic substrate, the plurality of wirings including:

a second wiring electrically connected to the anode;

a third wiring electrically connected to the first wiring; and a fourth wiring electrically connected to the isolation section, wherein the first wiring overlaps the third wiring and the first wiring is larger than the third wiring.

* * * * *